United States Patent
Niederlöhner et al.

(10) Patent No.: US 11,287,503 B2
(45) Date of Patent: Mar. 29, 2022

(54) METHOD FOR CONTROLLING PATIENT STIMULATING EFFECTS IN MAGNETIC RESONANCE IMAGING, CORRESPONDING COMPUTER PROGRAM AND COMPUTER-READABLE STORAGE MEDIUM, AND MAGNETIC RESONANCE IMAGING DEVICE

(71) Applicant: Siemens Healthcare GmbH, Erlangen (DE)

(72) Inventors: Daniel Niederlöhner, Erlangen (DE); Gudrun Ruyters, Erlangen (DE); Axel vom Endt, Erlangen (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 14 days.

(21) Appl. No.: 16/936,647

(22) Filed: Jul. 23, 2020

(65) Prior Publication Data
US 2021/0025956 A1    Jan. 28, 2021

(30) Foreign Application Priority Data
Jul. 24, 2019   (EP) .................................... 19188047

(51) Int. Cl.
*G01R 33/54* (2006.01)
*G01R 33/00* (2006.01)
(Continued)

(52) U.S. Cl.
CPC ....... *G01R 33/543* (2013.01); *G01R 33/0023* (2013.01); *G01R 33/288* (2013.01); *G01R 33/3852* (2013.01)

(58) Field of Classification Search
USPC ........................................................ 324/309
See application file for complete search history.

(56) References Cited

U.S. PATENT DOCUMENTS

| | | | |
|---|---|---|---|
| 6,169,403 B1 | 1/2001 | Hebrank | |
| 2006/0167496 A1* | 7/2006 | Nelson | A61N 1/37235 607/2 |
| 2007/0010737 A1 | 1/2007 | Harvey | |

FOREIGN PATENT DOCUMENTS

| | | |
|---|---|---|
| CN | 105738843 B | 10/2018 |
| DE | 19913547 C2 | 7/2003 |

OTHER PUBLICATIONS

Den Boer, J. A., et al. "Generalization to complex stimulus shape of the nerve stimulation threshold based on existing knowledge of its relation to stimulus duration for rectangular Stimuli." Proc Int Soc Magn Reson Med. vol. 7. 1999. pp. 1-1.
(Continued)

*Primary Examiner* — Rodney E Fuller
(74) *Attorney, Agent, or Firm* — Lempia Summerfield Katz LLC

(57) ABSTRACT

Methods and systems for controlling patient stimulating effects in MR imaging. The methods and systems include calculating a first effective stimulus duration independently for each pulse flank of an MRI sequence individually and calculating a second effective stimulus duration for which a respective history of a changing gradient field during the sequence is taken into account. Dependent on an evaluation of both the first and second effective stimulus durations a threshold value for an allowable rate of change in the magnetic gradient field is then calculated. The respective MRI sequence is then evaluated against the calculated threshold value to determine whether or not the respective MRI sequence is safe to apply.

20 Claims, 1 Drawing Sheet

Replacement Figures

(51) Int. Cl.
*G01R 33/28* (2006.01)
*G01R 33/385* (2006.01)

(56) References Cited

OTHER PUBLICATIONS

European Search Report for European Application No. 19188047.5-1010 dated Feb. 24, 2020.
International Electrotechnical Commission. "Particular requirements for the basic safety and essential performance of magnetic resonance equipment for medical Diagnosis." Medical Electrical Equipment: International Standard IEC (2010): 60601-2.

* cited by examiner

Replacement Figures

METHOD FOR CONTROLLING PATIENT STIMULATING EFFECTS IN MAGNETIC RESONANCE IMAGING, CORRESPONDING COMPUTER PROGRAM AND COMPUTER-READABLE STORAGE MEDIUM, AND MAGNETIC RESONANCE IMAGING DEVICE

CROSS REFERENCE TO RELATED APPLICATIONS

This application claims the benefit of EP 19188047.5 filed on Jul. 24, 2019, which is hereby incorporated by reference in its entirety.

FIELD

Embodiments relate to a method for controlling or monitoring patient stimulating effects in magnetic resonance imaging (MRI).

BACKGROUND

Magnetic resonance imaging is an established technique that is routinely used. It is, however, not without its risks for a respective imaged patient. It is known that the rapidly changing magnetic fields may lead to relatively strong electrical fields that in turn may potentially lead to unwanted peripheral nerve stimulation (PNS) and/or cardiac stimulations in patients. The stimulations may occur when the electrical fields are too strong and/or applied for too long periods of time and are considered an unwanted risk for the patients.

One approach for managing and limiting the risks is in determining the effective stimulus duration for the individual gradient pulses that are played out during an MRI sequence and to then check if the proposed MRI sequence leads to fields or effects that may exceed limits or threshold values based on the effective stimulus duration.

This approach has the disadvantage that it might not reliably prevent patient stimulations in all cases or for all pulse sequences.

Another known approach is using the so-called SAFE-model (Stimulation Approximation by Filtering and Evaluation) that has been developed for monitoring MRI sequences or applications with respect to PNS. When using the SAFE-model parameters of the model are fitted to results of computer-aided simulations of the expected PNS of a respective MRI sequence. It is possible to parameterise the SAFE-model to simultaneously ensure that limits for PNS as well as for cardiac stimulation are met. This approach may therefore provide the patient safety even for worst-case MRI sequences. A disadvantage of this approach is that it may lead to unnecessarily low limits and that the safe range of MRI sequences or pulse parameters is not fully utilised in many cases. This may in turn lead to an unnecessarily reduced performance of the imaging process.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide MR imaging that is safe with respect to patient stimulation without unnecessarily sacrificing imaging performance.

Embodiments implement a memory-function and combining this with a standard per-gradient pulse flank-calculation of an effective stimulus duration. A method serves to control or monitor for patient stimulating effects due to a changing magnetic gradient field in magnetic resonance imaging (MRI), for example with regards to cardiac stimulation. The method may, in other words, be used for controlling the—at least cardiac—stimulation or the generation of electrical fields that might potentially lead to stimulation, for example to cardiac stimulation. The method may be a computer-implemented method that could be executed or carried out using generic computational hardware such as a processor connected to a memory device as well as an input-output-system (I/O-system).

In a process step of the method a first effective stimulus duration is calculated for a given or predetermined MRI sequence for each monotonic gradient pulse flank of the sequence individually. The first effective stimulus duration is calculated for one pulse flank of the gradient pulses of the sequence at a time without taking into account any of the other gradient pulses or gradient pulse flanks of the sequence and thus independently from the other gradient pulses or gradient pulse flanks.

In a step of the method a second effective stimulus duration is calculated for the sequence. The first and second effective stimulus durations are calculated differently, i.e. in different ways or using different methods or algorithms. At least along the monotonic gradient pulse flanks of the sequence a respective history of the changing gradient field, i.e. a gradient activity or an activity of corresponding gradient coils, during the sequence up to the respective point in the sequence is taken into account to calculate the second effective stimulus duration for the sequence at the respective point. Therein, the history of the gradient field is taken into account independently of start and end points of the pulse flanks.

For the sequence a second effective stimulus duration is calculated for which at least along the monotonic gradient pulse flanks of the sequence a respective history of the changing gradient field during the sequence up to the respective point in the sequence is taken into account independently of start and end points of the gradient pulse flanks.

The history that is taken into account at a specific monotonic gradient pulse flank or point of the sequence may at least potentially completely or partially span multiple previous gradient pulse flanks. In this manner the second effective stimulus duration may be calculated for each monotonic pulse flank of the sequence, at or for each point of the monotonic gradient pulse flanks of the sequence using given time steps or a given time-resolution, or continuously, e.g. using an integral function. The second effective stimulus duration may similarly also be calculated along the complete sequence or for each point of the complete sequence, i.e. potentially even between gradient pulses or gradient pulse flanks.

The history that is taken into account at each gradient pulse flank or point of the sequence may be a respective partial or complete history. Only a part of the sequence from its starting point or beginning up to the respective gradient pulse flank or point or the complete sequence from its starting point or beginning up to the respective gradient pulse flank or point may be taken into account. This may for example depend on the location of the respective evaluated gradient pulse flank or point in the sequence, a length of the sequence, a density of the sequence in terms of gradient pulses or gradient pulse flanks per unit of time, available computational resources, and/or other factors.

In another step of the method dependent on an evaluation of both the first and second effective stimulus durations a threshold value or limit for an allowable change or rate of change in the magnetic gradient field is calculated. Against this limit or threshold value the sequence is then evaluated or compared to determine whether or not the sequence is safe to apply or continue with respect to potential patient stimulation.

Embodiments provide a safe and reliable evaluation and monitoring of potentially stimulating effects of an MRI sequence, for example, in terms of cardiac stimulation while at the same time providing at least on average improved performance compared to known techniques such as the above-mentioned SAFE-model. Another advantage is that the described method provides for flexible implementations and variants depending on individual requirements and available resources. For example, an implementation of the described method may relatively easily be realised in a FPGA/DSP-environment where only very limited storage space is available.

In the following the gradient pulses or gradient pulse flanks are also referred to as pulses or pulse flanks for short.

Previous approaches that don't implement a memory-function, i.e. that don't take into account a history of the gradient activity, for calculating an effective stimulus duration for a pulse flank may lead to critical or dangerous situations. This may be the case based on the insight that multiple consecutive or back-to-back monopolar gradient pulses, i.e. gradient pulses with the same sign or polarity, may lower a stimulation threshold of tissue exposed to the pulses or corresponding electromagnetic fields. This effect is, however, ignored in traditional approaches that only calculate the effective stimulus duration for each pulse flank individually. Another critical scenario might be a breaking up of a single gradient pulse that would have an exceedingly large effective stimulus duration into multiple shorter pulses. The multiple short pulses might then individually meet the safety limits while the longer pulse that is made up of the multiple short pulses does not. This scenario might be relatively uncommon in practical MRI applications but it also cannot be completely ruled out and may thus pose a real risk for the respective patient.

It is also important to note that the mentioned traditional approach is based on the assumption of ideal monotonic pulse flanks. In practice, however, there is typically an overshoot or undershoot at the ends of supposedly monotonic pulses, for example a transition from an increasing or decreasing pulse flank into a constant value of the gradient field, e.g. because of the non-zero reaction time of a hardware controller. When the gradient field follows a step function each positive or increasing step is followed by a short decreasing or negative pulse flank due to the overshooting effect and similarly each negative or decreasing pulse flank of the step wise changing gradient field is followed by a shorter positive or increasing pulse flank due to the undershooting effect. In the traditional approach such a step wise changing gradient field might be composed of many individual monotonic pulse flanks with changing signs. The many individual pulse flanks might then be evaluated individually, which does not reflect very well the physiological reality that multiple successive steps with the same sign may include a significant cumulative effect even if they are interrupted by relatively small overshooting or undershooting spikes.

Embodiments solve or mediate these problems by taking into account the history of the sequence.

As mentioned, using the above-mentioned SAFE-model may in many cases lead to unnecessarily low limits or threshold values and thus cause suboptimal imaging performance. Embodiments solve or mediate this problem by evaluating both the first and second effective stimulus durations. The evaluation may, for example, include a comparison of the two effective stimulus durations against each other and/or against a predetermined value, and/or other operations. Depending on individual requirements, for example, the larger of the two calculated effective stimulus durations may be used to realise a conservative, i.e. particularly safe, control of stimulating effects, or the smaller one of the two calculated effective stimulus durations might be used to increase imaging performance by allowing stronger and/or longer gradient pulses or a sequence with a higher pulse density.

Embodiments may be used in simulations, i.e. look-ahead calculations before an actual imaging of the respective patient is started, and/or it may be used for live- or online-calculations during an actual MR imaging process of the respective patient. If the threshold value or limit is exceeded at any time during the simulation or imaging process, a warning may be issued so that the sequence may be changed and/or an automatic abortion or shutdown of the simulation or the imaging process may be automatically triggered.

In an embodiment, the first effective stimulus duration is calculated by an algorithm that implements the corresponding standard IEC 60601-2-33 as it is proposed in edition 3.2 of June 2015. The specification of the above-mentioned standard defines measures for avoiding PNS and cardiac-stimulations. This includes definitions, such as for the effective stimulus duration $t_{s,eff}$, as well as limits related to the prevention of cardiac stimulation that must not be exceeded by certain parameters, such as limits for an electrical field and for a rate of change of a magnetic gradient field. In the above-mentioned standard $t_{s,eff}$ refers to the duration of any period of monotonic increasing or decreasing gradient and is used to describe its limits for cardiac or peripheral nerve stimulation. $t_{s,eff}$ is defined as the ratio of the peak-to-peak field variation and the maximum value of the time derivative of the gradient in that period. To protect against cardiac stimulation in each operating mode the gradient output of all gradient units, i.e. the parts or hardware of an MRI device responsible for creating or generating gradient fields, shall satisfy $$E < \frac{2}{\left(1 - \exp\left(-\frac{t_{s,eff}}{3}\right)\right)}$$

where $t_{s,eff}$ is the effective stimulus duration in milliseconds and E is the electric field induced by gradient switching in V/m. For MR equipment provided with whole-body gradient systems this limit may be replaced by $$dB/dt < \frac{20}{\left(1 - \exp\left(\frac{t_{s,eff}}{3}\right)\right)}$$

where dB/dt is the rate of change of the magnetic field during gradient switching in T/s.

For longer effective stimulus durations the limit for dB/dt gets continuously smaller and asymptotically approaches a value of dB/dt=20 T/s. For smaller values of the effective stimulus duration $t_{s,eff}$ dB/dt may, however, be significantly higher. Since the limits and the above-mentioned standard as a whole don't define or implement any memory function, i.e. don't take into account any signal or gradient activity history, the algorithm implementing the above-mentioned standard, i.e. the formulae, definitions, and/or limits given therein, lead to the categorisation of relatively high or intense peaks or sequences as safe and allowable. Compliance with or observance of the above-mentioned standard may lead to an optimal safe imaging performance, i.e. resulting MR image quality. At the same time the corresponding above-mentioned algorithm may be implemented and executed relatively fast and easy using relatively limited computational resources.

Embodiments determine which one of the first and second effective stimulus durations is longer, i.e. greater or larger, as part of the evaluation of the first and second effective stimulus durations. Only the determined longer one of the first and second effective stimulus durations is used to calculate the threshold value. The other one, i.e. the shorter effective stimulus duration, may be discarded and may not be taken into account further in the presently described method. The threshold value may correspond to the limit of dB/dt mentioned in the standard specification IEC 60601-2-33. In only using or taking into account the longer one of the two differently calculated effective stimulus durations a conservative, i.e. especially safe, controlling or monitoring for the potentially stimulating effects may be implemented and ensured. This is the case, because a longer effective stimulus duration leads to a smaller threshold value or limit that is then observed during simulation of the respective MRI sequence and/or the actual respective imaging process. For example, the threshold value may be calculated as:

$$L_{cardiac}^{xyz}(t_{s,eff}^{xyz}) = \frac{20}{1 - \exp\left(-\frac{t_{s,eff}^{xyz}}{3}\right)}$$

where xyz indicates that the respective parameter may be calculated individually for each spatial dimension if multiple overlapping gradients or gradient fields with different axes are used (see below), and $$t_{s,eff}^{xyz} = \max(t_{s,eff,std}^{xyz}, t_{s,eff,mem}^{xyz}).$$

Therein, $t_{s,eff,std}^{xyz}$ refers to the first effective stimulus duration, that be calculated as described in the above-mentioned standard IEC 60601-2-33, and $t_{s,eff,mem}^{xyz}$ refers to the second effective stimulus duration calculated in dependence on the gradient history.

In an embodiment, only the history of gradient activity inside a sliding time window of predetermined length extending back in time from the respective current point in time and/or in the sequence is taken into account for calculating the second effective stimulus duration. If a time between a start or beginning of the sequence and a respective current pulse flank or point in the sequence for which the second effective stimulus duration is calculated is longer than the predetermined length of the sliding time window, then only part of the sequence up to the respective pulse flank or point is taken into account according to the predetermined length of the sliding time window. At the start of the sequence, i.e. for relatively early pulse flanks or points in the sequence, the sliding time window may extend back in time to before the start of the sequence. Values for the gradient activity for the period of time inside the sliding time window but before the start of the sequence may be set to 0. It is also possible to take into account just the complete history or gradient activity from the beginning of the sequence to the respective current pulse flank or point up until the predetermined length of the sliding time window is shorter than the distance between the current pulse flank or point in the sequence and the beginning of the sequence. As the sequence or calculation of the second effective stimulus duration along the sequence progresses from the beginning of the sequence the amount of previous data, i.e. the amount of history of the gradient activity, may dynamically increase up to the predetermined length of the sliding time window.

Using a sliding time window-approach may limit the computational effort and resources needed for controlling the potentially stimulating effects and may allow the use of the presently proposed method for real-time applications and/or with less powerful hardware. At the same time the sliding time window-approach does not necessarily increase the risk for the patient compared to always taking into account complete history of the gradient activity. This is based on the insight that an effect of a certain gradient activity on the patient in terms of potential stimulation gets smaller and smaller over time, i.e. the farther back in time the respective gradient activity happened.

The predetermined length of the sliding time window may be static or dynamic. In the first case the length of the sliding time window may be a given fixed number that is valid and used throughout the respective simulation and/or imaging process. In the second case the length of the sliding time window may change dynamically according to a given or predetermined mathematical relationship or function. For example, the length of the sliding time window may change, i.e. may be dynamically adjusted, throughout the sequence depending on predetermined characteristics of the sequence, such as for example a height, width, and/or density in time of the gradient pulses of the sequence, an average repetition time, and average echo time, and/or the like. For example, a longer sliding time window may be used for a sequence that has a higher density of gradient pulses, gradient pulses with greater amplitude or intensity, shorter repetition times, and/or shorter echo times. This dynamic adjustment of the length of the sliding time window may provide for even lower computational requirements while at the same time still ensuring the safety of the sequence and the corresponding imaging process.

In an embodiment, the sliding time window includes a predetermined length between 3 ms and 300 ms, for example between 3 ms and 20 ms. The predetermined length may be the fixed length or a maximum length of the sliding time window. The proposed length may take into account the physiological refractory period.

In an embodiment, a weight function is used in calculating the second effective stimulus duration. The weight function assigns a lower weight to gradient activity that lies farther back in time than to gradient activity that is closer in time to the respective current pulse flank or point in the sequence for which the second effective stimulus duration is calculated. The weight function implements a limited memory or controlled data loss function so that a signal or gradient activity that lies farther back in time has no or a lower influence compared to a signal or gradient activity that is closer in time to the respective current pulse flank or point. The use of a weight function may limit an amount of data that has to be stored and evaluated at each point or pulse flank in the sequence, thus limiting necessary computational time and resources and aiding real-time applications.

The weight function may be combined with the described use of a sliding time window for the history of the gradient activity that is to be taken into account. Through the use of the weight function an influence that the dropping out of the sliding time window of a respective gradient activity, i.e. a certain pulse or pulse flank, has on the calculated value of the second effective stimulus duration at respective current point in the sequence may be limited or smoothed out. In other words, gradient activity that is about to be dropped out of the sliding time window, i.e. out of the history of gradient activity that is taken into account at the respective point, is at that point already not factored into the calculation of the second effective stimulus duration with full weight. Overall, the proposed approach may provide more sensible and easier to understand calculations that may be carried out efficiently with limited computational effort.

In an embodiment, the weight function assigns a constant non-zero weight to a first portion of the gradient activity history. To a second portion of the gradient activity history that lies further back in time than the first portion the weight function assigns weights according to a predetermined function that monotonically decreases, for example to 0, in a direction back in time from the respective current point of the sequence for which the second effective stimulus duration is calculated. The constant value, i.e. the weight assigned to the first portion of the gradient activity history, may in principle be set to arbitrary value, but may for simplicity's sake be set to 1 or 100%.

When combined with the described sliding time window the weight function and thus the assigned weights for the second portion of the gradient activity history may decrease such that the weight function reaches zero at the beginning, i.e. the earliest point, of the sliding time window providing that as the sliding time window moves forward in time along the sequence the gradient activity smoothly drops out of the sliding time window and therefore does not cause any unnecessary or unrealistic jumps or discontinuities in the calculated values of the second effective stimulus duration.

The first portion and/or the second portion of the gradient activity history may each include multiple points of the sequence, i.e. multiple values of gradient activity.

In an embodiment, the weight function at least for a portion of the gradient activity history, for example, for the second portion, assigns linearly decreasing weights according to a predetermined linear function that monotonically decreases going back in time from the respective current point of the sequence for which the second effective stimulus duration is presently calculated. Points or parts of the respective gradient activity history up to the respective pulse flank or point in the sequence get assigned smaller and smaller weights the older they are from the point of view of the respective current point in the sequence and thus have linearly decreasing influence on the calculated value of the second effective stimulus duration. The linear function or linear decrease of the assigned weights may start from the respective current point in the sequence or at an earlier point in the sequence.

If combined with the sliding time window-approach the linear function or linear decrease may in the direction back in time continue to the beginning of the sliding time window or end at a later point in time, i.e. somewhere inside the sliding time window. Between the end of the linear function or linear decrease and the beginning of the sliding time window another function or constant value may then be used for the assigned weights. The use of a linear function for determining the weights to be assigned may be implemented and adjusted relatively easily and may limit the necessary computational resources.

In an embodiment, the weight function at least for a portion of the gradient activity history, for example, for the earlier second portion, assigns exponentially decreasing weights to the points or parts of the respective historic gradient activity according to a predetermined exponential function that exponentially decreases going back in time.

The details and variations as described with respect to the linearly decreasing function may be applied correspondingly. For example, the exponential function or the corresponding exponential decrease of the assigned weights may start from the respective current point in the sequence or from an earlier point in time, i.e. an earlier point in the sequence, and may go back in time to the beginning of the sequence or to the beginning of a sliding time window, or to a predetermined point inside the sliding time window if such a sliding time window is used for determining the respective gradient activity history that is to be taken into account.

Using an exponentially decreasing function for the weights may also be implemented relatively easily and may also allow for a relatively easy adjustment by setting a predetermined time constant of the exponential function to a user-given value.

For the exponential weighting, i.e. when using the weight function that at least for a portion of the gradient activity history assigns exponentially decreasing weights, the sliding time window may be of essentially arbitrary or unlimited length. For example, the length of the sliding time window may then be limited by or set according to boundary conditions or limitations of a chosen implementation method, i.e. a programming language and/or available computational resources.

In a first variation the assigned weights drop exponentially in the direction back in time to the beginning of the sliding time window and are set to 0 for any points or values of the gradient activity before that.

In a second variation, however, the exponentially decreasing weight function starts at the respective current point in the sequence and continues back in time continuously with no specific endpoint such that the assigned weights continuously approach or go towards −infinity the further back in time from the respective current point the sequence the respective gradient activity happened. The second variant may be implemented efficiently since the second variant provides for limiting the amount of data that needs to be stored. For example, it is not necessary to store all data points of the gradient activity for the entire sequence or the entire length of the sliding time window up to the respective current point (t=0). Instead, the exponential decrease or exponentially decreasing characteristic of the weight function may be implemented as a simple multiplication using a constant factor $\kappa$ with $\kappa=\exp(-dt/\tau)$ where $\tau$ is the characteristic time constant. The second effective stimulus duration may then be calculated iteratively with a respective new value (e.g. at timestep 0) given as the product of $\kappa$ and the respective previous value of the second effective stimulus duration (e.g. at timestep −1). A signed timestep may be added as necessary and additional conditions or constraints may be taken into account, such as for example a predetermined threshold that limits which values of the second effective stimulus duration are taken into account as will be described further down below.

In an embodiment, the weight function assigns monotonically decreasing weights to points or parts of the respective historic gradient activity up to that respective point in the sequence according to a predetermined step function with multiple steps that monotonically decrease going back in time from the respective point of the sequence. In other words, one or more points or values of the gradient activity may be assigned a first constant value. One or more points or values of the gradient activity lying further back in time may then be assigned a smaller second constant value, and one or more points or values of the gradient activity lying even further back in time may be assigned an even smaller third constant value and so on. The constant values and/or their ratios are defined or given by the predetermined step function.

Embodiments may include where the step function defines more than two, for example at least five or more different steps, i.e. if the stepwise decrease of the assigned weights is staggered over more than two, at least five or more, different steps or levels. This is, for example, the case when using the described sliding time window-approach. In that example, the steps of the step function may be set to occur at regular time intervals over the length $T_{win}$ of the sliding time window, e.g. t=0, at $-T_{win}/5$, at $-T_{win}*2/5$, at $-T_{win}*3/5$, at $-T_{win}*4/5$, and at $-T_{win}$. Using more and thus smaller steps may also smooth out the effects or influences of certain gradient activities or pulses dropping out of the sliding time window without needing to assign different weights to every single point or value of the gradient activity.

In an embodiment, only absolute values of the time differentiated gradient or gradient field that are greater than a predetermined threshold are taken into account for calculating the second effective stimulus duration. Before calculating the second effective stimulus duration a time derivative dB/dt of the gradient activity may be calculated and a thresholding step may be performed on the absolute values of the time differentiated gradient activity. Gradient activity with an absolute time derivative smaller than the predetermined threshold is then discarded, i.e. not taken into account for calculating the second effective stimulus duration. This is based on the insight that relatively weak or slow changing gradient activity that is below the predetermined threshold may safely be maintained indefinitely and does therefore not need to be taken into account when evaluating the safety of the respective sequence.

As may be seen from the IEC standard 66601-2-33 values of dB/dt between −20 T/s and +20 T/s are not stimulating regardless of a duration over which they are applied. Correspondingly, a lower limit for values that are taken into account for calculating the effective stimulus duration may be implemented by the proposed thresholding. The proposed thresholding also provides for dealing with noise in real measured values, i.e. measured MR data, that may otherwise pose a problem in adding or integrating steps. Through the proposed thresholding relatively small or slow changing measured values may be discarded or ignored, thus avoiding corresponding potentially critical or problematic effects or influences of noise on the respective end results. The proposed thresholding therefore offers a convenient and relatively easy to implement method for improving the reliability and value of the calculations and results.

In an embodiment, the respective threshold value or limit for the allowable rate of change in the magnetic gradient field is calculated for multiple spatial dimensions (x, y, z). A square root of a sum of the squares of ratios of the time differentiated gradient activity for each spatial dimension to the corresponding threshold value is calculated to determine a relative stimulation probability for the respective sequence. This may be expressed for the relative cardiac stimulation probability $S_{cardiac,rel}$ as:

$$S_{cardiac,rel} = \sqrt{\left(\frac{(dG/dt)_x}{L^x_{cardiac}(t^x_{s,eff})}\right)^2 + \left(\frac{(dG/dt)_y}{L^y_{cardiac}(t^y_{s,eff})}\right)^2 + \left(\frac{(dG/dt)_z}{L^z_{cardiac}(t^z_{s,eff})}\right)^2}$$

where G refers to the respective magnetic gradient indicated by the dimensional index x, or y, or z, respectively, and $L_{cardiac}$ refers to the corresponding calculated threshold value or limit for the allowable rate of change of the respective gradient. $S_{cardiac,rel}$ is to be seen relative to the threshold value calculated according to the standard IEC 60601-2-33.

In clinical MR devices multiple gradients with different directions or gradient axes x, y, z are applied, often simultaneously. The calculations of the effective stimulus durations and the threshold values may be performed independently for each gradient or gradient axis to make the calculations easier and faster to execute. The independent results may then be combined with each other, for example according to the above given formula. This offers a practical way of determining the safety of the respective sequence even in complex modern MR applications and measurements with multiple gradients, where calculating just the single effective gradient field at each point may be too difficult and complex, for example for real-time calculations.

Embodiments also provide a computer program or computer program product including instructions that, when the computer program is executed by a computer, cause the computer to carry out the method described herein. The computer may be a generic computer or data processing device. The computer may be a data processing device or data processing unit of or connected to a magnetic resonance imaging device. The computer may include a processor, a data storage device connected thereto, and an I/O-system for receiving or accessing data and for outputting calculated results. The computer may include a microchip, microprocessor, controller, an ASIC, and/or the like.

Embodiments also provide a computer-readable storage medium including stored on the computer program described above. The computer-readable storage medium may be the data storage device mentioned in conjunction with the computer program and/or may be connectable to the computer for executing the start computer program.

Embodiments also provide a magnetic resonance imaging device (MRI device) including an imaging system for acquiring magnetic resonance data of a subject, a control unit for controlling the imaging system according to a predetermined imaging sequence, and further including a user interface over that the respective imaging sequence may be defined. The control unit includes a computer-readable storage medium and a processor or data processing unit adapted to execute the computer program stored on this computer-readable storage medium. The magnetic resonance imaging device may be adapted to execute at least one variant or development of the method described herein. The imaging system may, for example, include one or more magnetic coils for generating an essentially static magnetic field as well as for generating at least one magnetic gradient field that may change over time, e.g. be generated or applied in pulses. The imaging system may further include a corresponding signal generator, an amplifier, and/or other electrical or electronic components.

The embodiments and developments described herein for at least one, that is, at least for the method, the magnetic resonance imaging device, the computer program, and/or the computer-readable storage medium, as well as the corresponding advantages may be applied to any and all described aspects.

DETAILED DESCRIPTION

Figure 1:
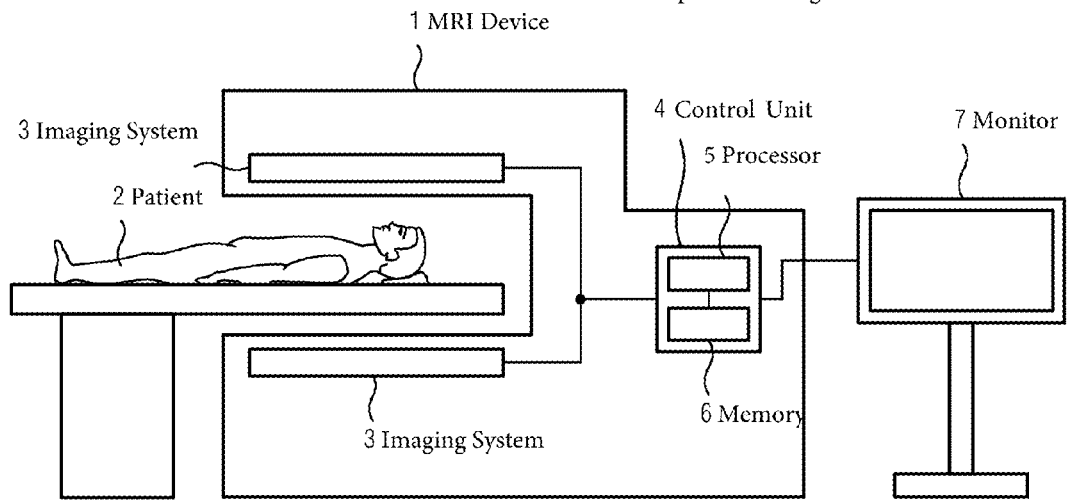
FIG. 1 depicts a magnetic resonance imaging device adapted to control a patient stimulation according to an embodiment.

FIG. 1 depicts a magnetic resonance imaging device or MRI device 1 for short. The MRI device 1 may be used for imaging a patient 2, for example for acquiring MR data of the patient 2 and to generate a magnetic resonance image of the patient 2. The MRI device 1 includes an imaging system 3 that is here only indicated schematically. The imaging system 3 may for example include magnetic coils for generating a variable magnetic gradient field in a space occupied by the patient 2. The MRI device 1 further includes a control unit 4 for controlling the imaging system 3, for processing the MR data acquired by the imaging system three, and for generating a corresponding MR image of the patient 2. The control unit 4 may also be used for simulating an actual imaging process beforehand, for example, with the purpose of determining whether or not a proposed MRI sequence is safe for the patient 2 in terms of potentially stimulating effects, for example cardiac stimulation.

The control unit 4 itself includes a processor 5 and connected thereto a memory 6. Stored on the memory 6 is a computer program that includes or encodes instructions that, when executed by the processor 5 or the control unit 4, respectively, cause the control unit 4 or the MRI device 1 as a whole to carry out the tasks and methods described herein. Corresponding results, such as a message, an input request, the generated MR image, and/or the like, may be output to a respective user by a schematically shown monitor 7 that may be part of the MRI device 1 or connected thereto.

Figure 2:
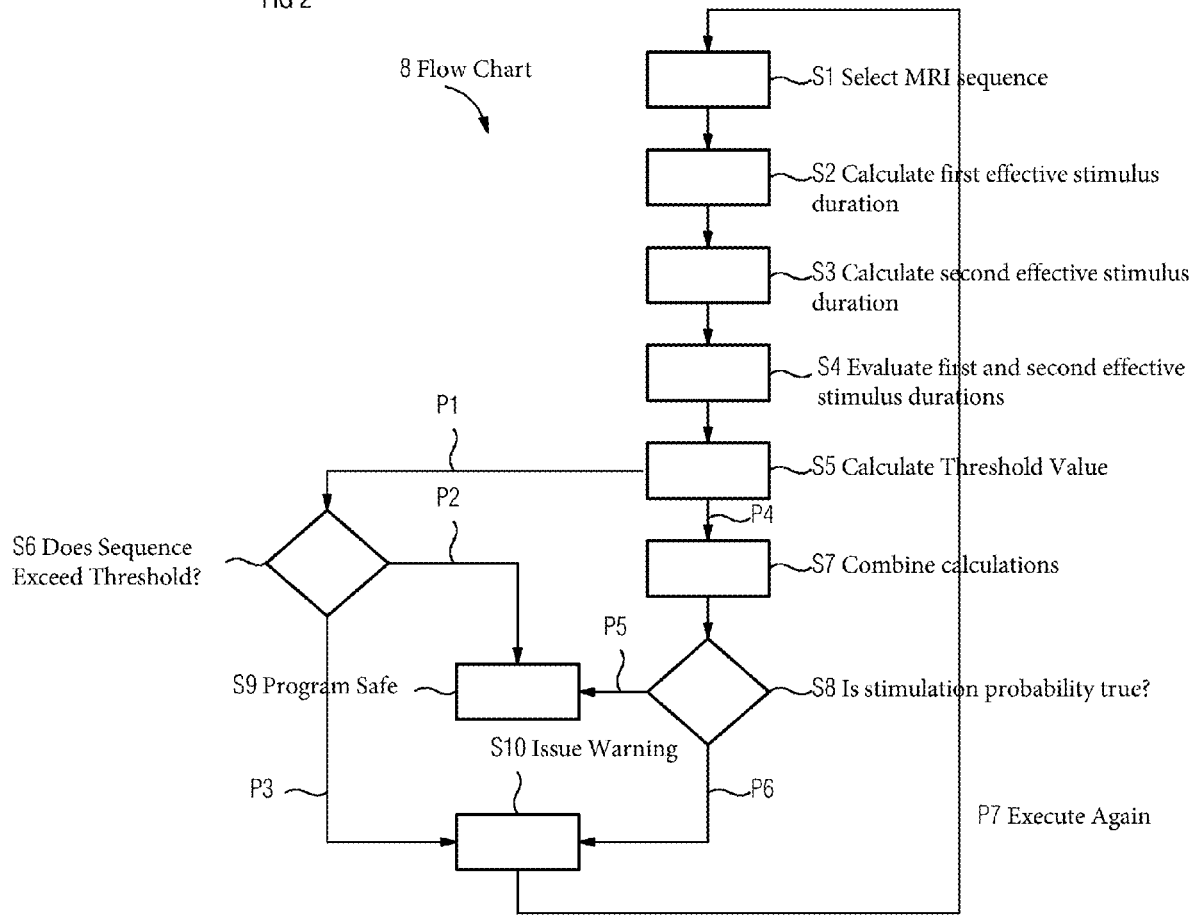
FIG. 2 depicts a flow chart for a method for controlling a patient stimulation in MRI imaging according to an embodiment.

FIG. 2 depicts a flow chart 8 for a method for controlling a patient stimulation or patient stimulating effects in magnetic resonance imaging. The method may be carried out using the MRI device 1. Correspondingly, the mentioned computer program stored on the memory 6 may implement the method, i.e. the flowchart 8. The flowchart 8 includes multiple process steps S1 to S10 and multiple program path, only some of which are presently indicated as P1 to P7. The process steps and program path of the flowchart 8 may represent functions, routines, and/or instructions of the computer program stored on the memory 6.

The problem of unwanted stimulations in MR imaging is known. For example, the IEC standard 60601-2-33 proposes limits for an electric field induced by gradient switching and/or for a maximum allowable rate of change of the magnetic field during a gradient switching based on an effective stimulus duration. Other approaches in dealing with patient stimulation include application of the so-called SAFE-model. Both of the approaches do, however, include their own problems and disadvantages.

To remedy the problems and disadvantages, embodiments calculate and evaluate two different effective stimulus durations as will be described below.

In process step S1 a respective MRI sequence to be used for imaging the patient 2 is selected or defined. This may be done manually by a respective user or automatically or semi-automatically by the MRI device 1, for example based on detected characteristics of the patient 2 and/or previous medical data of the patient 2.

In process step S2 a first effective stimulus duration $t_{s,eff,std}$ is calculated independently for each monotonic pulse flank of the proposed MRI sequence individually. This may be done for all monotonic pulse flanks of the sequence in parallel or one after the other. It is also possible to implement an iterative execution of the flowchart 8 or the corresponding method. In each process step S2 the first effective stimulus duration $t_{s,eff,std}$ is only calculated for one of the monotonic pulse flanks of the proposed MRI sequence. The first effective stimulus duration $t_{s,eff,std}$ may be calculated according to the definitions and formulae put forth in the IEC standard 60601-2-33, in edition 3.2 of June 2015.

In process step S3 a second effective stimulus duration $t_{s,eff,mem}$ is calculated for the proposed MRI sequence. In calculating the second effective stimulus duration a respective history of signal or gradient activity is taken into account at each point or pulse flank along the proposed MRI sequence, thus implementing a memory. A sliding time window that extends back in time from the respective pulse flank or a point of the MRI sequence is used to determine the gradient activity that is to be taken into account for the respective calculation of the second effective stimulus duration $t_{s,eff,mem}$. For gradient activity, for example changes in the gradient field generated by the imaging system 3, during this sliding time window a respective duration of the gradient activity is multiplied with its sign and a time-dependent weight function W(t) and is then summed up for every point:

$$t_{s,eff,mem}^{xyz}(t_i) = dt \cdot \sum_{t_i-T_{win}}^{t_i} W(t_i) \cdot \mathrm{sign}\left(\frac{dG_{xyz}}{dt}(t_i)\right)$$

Instead of the discrete summation it is also possible to formulate the same calculation as an integral for continuous data.

The weight function W(t) defines weights that are assigned to the gradient activity and implements or represents the mentioned memory or memory function. This is influenced by the predetermined length $T_{win}$ of the sliding time window as well as the type and parameters of the weight function W(t). The latter determines how gradient activity data is "forgotten" by the algorithm calculating the second effective stimulus duration $t_{s,eff,mem}$. Some examples for the weight function W(t) are as follows:

W(t) may have a constant value of 1 from t=0 to t=$-T_{win}$.

W(t) may have a constant value of 1 from t=0 to t=$-T_{win}/2$ and decrease linearly to 0 from t=$-T_{win}/2$ to t=$-T_{win}$.

W(t) may have a constant value of 1 from t=0 to t=$-T_{win}/5$, a constant value of 0.8 from t=$-T_{win}/5$ to t=$-T_{win}2/5$, a constant value of 0.6 from t=$-T_{win}2/5$ to t=$-T_{win}3/5$, a constant value of 0.4 from t=$-T_{win}3/5$ to t=$-T_{win}4/5$, a constant value of 0.2 from t=$-T_{win}4/5$ to t=$-T_{win}$.

W(t) decreases linearly from a value of 1 at t=0 to a value of 0 at t=$-T_{win}$.

W(t) decreases exponentially from a value of 1 at t=0 to t=−$T_{win}$ with the predetermined characteristic time constant τ and has a value of 0 for t<−$T_{win}$.

W(t) decreases exponentially from a value of 1 at t=0 to t=−infinity with the predetermined characteristic time constant τ.

Only absolute values of the time differentiated gradient activity the $dG_{xyz}/dt(t_i)$ that exceed a predetermined threshold thl may be taken into account in the summation or integration:

$$t_{s,eff,mem}^{xyz}(t_i) = dt \cdot \sum_{t_i-T_{win}}^{t_i} W(t_i) \cdot \text{sign}\left(\left.\left|\frac{dG_{xyz}}{dt}(r_i)\right|\right._{>thl}\right)$$

In process step S4 both the first and second effective stimulus durations are evaluated to determine their maximum, i.e. the larger or longer one of the first and second effective stimulus durations as the effective stimulus duration $t_{s,eff}$.

In process step S5 a threshold value $L_{cardiac}$ for the maximum allowable rate of change in the magnetic gradient field is calculated based on the effective stimulus duration $t_{s,eff}$:

$$L_{cardiac}^{xyz}(t_{s,eff}^{xyz}) = \frac{20}{1-\exp\left(-\frac{t_{s,eff}^{xyz}}{3}\right)}$$

The flowchart 8 then follows the program path P1 to process step S6. In process step S6 it is checked, if the proposed sequence at any point exceeds the calculated threshold value or limit $L_{cardiac}$. If this is not the case, the flowchart 8 follows a program path P2. If, however, it is determined that the sequence in at least one point exceeds the calculated threshold value or limit $L_{cardiac}$, the flowchart 8 follows a program path P3 to process step S10.

In process step S10 a warning regarding the proposed sequence exceeding the calculated threshold value or limit $L_{cardiac}$, is issued to a respective user, e.g. on the monitor 7. This may be the case if the calculations take place during a simulation run of the proposed MRI sequence. If the described calculations take place in real-time during an actual measurement or imaging process of the patient 2, then the imaging process may automatically be aborted in process step S10. A corresponding warning or information may also be displayed on the monitor 7 or be output in another way.

The respective user or medical personnel may then adjust the proposed or used MRI sequence accordingly and the described process steps may be executed again, that is indicated here by the looping program path P7.

If multiple gradients or gradient fields with different directions or axes are used or are proposed to be used according to the respective MRI sequence the flowchart 8 may also follow a program path P4 from the process step S5 to the process step S7. In the process step S7 the calculations for the different gradients are combined into a relative stimulation probability $S_{cardiac,rel}$ for the respective MRI sequence. In this case, calculating the first and second effective stimulus durations as well as the threshold value $L_{cardiac}$ in the process steps S2, S3 and S5 may include respective separate calculations for each gradient or gradient axis.

In a process step S8 it is determined if $S_{cardiac,rel}<1$ or if $S_{cardiac,rel}>1$ is true. If $S_{cardiac,rel}$ is smaller than 1, then the respective MRI sequence may be considered safe and the flowchart 8 follows a program path P5. $S_{cardiac,rel}=1$ provides that the probability to cause a cardiac stimulation is $2 \cdot 10^{-9}$ for the average patient 2.

If following the program path P2 and/or the program path P5 the process step S9 is reached, then the proposed MRI sequence may be considered safe and thus may be applied or continued in the process step S9. This may also be indicated by a corresponding message that may be issued or output to the respective user through the monitor 7 or any other mechanisms.

If in process step S8 it is determined that $S_{cardiac,rel}$ equal to or greater than 1, the flowchart 8 follows the program path P6 to the process step S10 where a corresponding warning may be output and/or the execution of the respective MRI sequence, for example, the corresponding imaging process, may automatically be aborted or shut down.

The described examples show how an improved signal processing for controlling or monitoring cardiac stimulations in MR imaging may be achieved through the use of a memory function implemented through a weight function W(t) in combination with complying with the normative requirements for individual pulse flank evaluation.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for controlling patient stimulating effects in magnetic resonance imaging due to a change in a changing magnetic gradient field, the method comprising:
    calculating, for an MRI sequence, a first effective stimulus duration independently for each monotonic gradient pulse flank of the MRI sequence individually;
    calculating, for the MRI sequence, a second effective stimulus duration for which at least along monotonic gradient pulse flanks of the MRI sequence a respective history of the changing magnetic gradient field during the MRI sequence up to a respective point in the MRI sequence is taken into account; and
    calculating, based on an evaluation of the first effective stimulus duration and the second effective stimulus duration, a threshold value for an allowable rate of change in the changing magnetic gradient field against which the MRI sequence is evaluated to determine whether or not the MRI sequence is safe to apply.

2. The method of claim 1, wherein the first effective stimulus duration is calculated by an algorithm that implements IEC 60601-2-33.

3. The method of claim 1, wherein the evaluation of the first and second effective stimulus durations comprises determining which one of the first and second effective stimulus durations is longer, and only the determined longer one of the first and second effective stimulus durations is used to calculate the threshold value.

4. The method of claim 1, wherein only a history of gradient activity inside a sliding time window of predetermined length extending back in time from a respective current point is used for calculating the second effective stimulus duration.

5. The method of claim 4, wherein the sliding time window includes a predetermined length between 3 ms and 300 ms.

6. The method of claim 4, wherein the sliding time window includes a predetermined length between 3 ms and 20 ms.

7. The method of claim 1, wherein calculating the second effective stimulus duration comprises using a weight function that assigns a lower weight to gradient activity that temporally precedes gradient activity that is temporally closer to the respective current gradient pulse flank or point in the sequence for which the second effective stimulus duration is calculated.

8. The method of claim 7, wherein the weight function comprises:
assigning a constant non-zero weight to a first portion of a gradient activity history, and
assigning to a second portion of the gradient activity history that temporally precedes the first portion weights according to a predetermined function that monotonically decreases in a direction back in time from the respective current point of the sequence.

9. The method of claim 8, wherein the predetermined function monotonically decreases to zero.

10. The method of claim 7, wherein the weight function at least for a portion of a gradient activity history assigns linearly decreasing weights according to a predetermined linear function that monotonically decreases going back in time.

11. The method of claim 7, wherein the weight function at least for a portion of a gradient activity history assigns exponentially decreasing weights according to a predetermined exponential function that exponentially decreases going back in time.

12. The method of claim 7, wherein the weight function assigns monotonically decreasing weights according to a predetermined step function with multiple steps that monotonically decrease going back in time.

13. The method of claim 1, wherein for calculating the second effective stimulation duration only absolute values of a time derivative of the gradient being greater than a predetermined threshold are taken into account.

14. The method of claim 1, wherein the respective threshold value is calculated for multiple spatial dimensions and a square root of a sum of the squares of ratios of a time derivative of the gradient activity for each spatial dimension to the corresponding threshold value is calculated to determine a relative stimulation probability for the sequence.

15. A non-transitory computer implemented storage medium that stores machine-readable instructions executable by at least one processor for controlling patient stimulating effects in magnetic resonance imaging due to a changing magnetic gradient field, the machine-readable instructions comprising:
calculating, for an MRI sequence, a first effective stimulus duration independently for each monotonic gradient pulse flank of the MRI sequence individually;
calculating, for the MRI sequence, a second effective stimulus duration for which at least along monotonic gradient pulse flanks of the MRI sequence a respective history of the changing magnetic gradient field during the MRI sequence up to a respective point in the MRI sequence is taken into account; and
calculating, based on an evaluation of the first effective stimulus duration and the second effective stimulus duration, a threshold value for an allowable rate of change in the changing magnetic gradient field against which the MRI sequence is evaluated to determine whether or not the MRI sequence is safe to apply.

16. The non-transitory computer implemented storage medium of claim 15, wherein the evaluation of the first effective stimulus duration and the second effective stimulus duration comprises determining which one of the first and second effective stimulus durations is longer, and only the determined longer one of the first and second effective stimulus durations is then used to calculate the threshold value.

17. The non-transitory computer implemented storage medium of claim 15, wherein calculating the second effective stimulus duration comprises using a weight function that assigns a lower weight to gradient activity that temporally precedes gradient activity that is temporally closer to the respective current gradient pulse flank or point in the sequence for which the second effective stimulus duration is calculated.

18. A magnetic resonance imaging device comprising:
an imaging system configured to acquire magnetic resonance data of a subject;
a control unit configured to control the imaging system according to a predetermined imaging sequence; and
a user interface over that the predetermined imaging sequence may be defined,
wherein the control unit comprises a computer-readable storage medium and a processor configured to execute machine-readable instructions stored on the computer-readable storage medium, the machine-readable instructions comprising:
calculating, for an MRI sequence, a first effective stimulus duration independently for each monotonic gradient pulse flank of the MRI sequence individually;
calculating, for the MRI sequence, a second effective stimulus duration for which at least along monotonic gradient pulse flanks of the MRI sequence a respective history of the changing magnetic gradient field during the MRI sequence up to a respective point in the MRI sequence is taken into account; and
calculating, based on an evaluation of the first effective stimulus duration and the second effective stimulus duration, a threshold value for an allowable rate of change in the changing magnetic gradient field against which the MRI sequence is evaluated to determine whether or not the MRI sequence is safe to apply.

19. The magnetic resonance imaging device of claim 18, wherein the evaluation of the first effective stimulus duration and the second effective stimulus duration comprises determining which one of the first and second effective stimulus durations is longer, and only the determined longer one of the first and second effective stimulus durations is then used to calculate the threshold value.

20. The magnetic resonance imaging device of claim 18, wherein calculating the second effective stimulus duration comprises using a weight function that assigns a lower weight to gradient activity that temporally precedes gradient activity that is temporally closer to the respective current gradient pulse flank or point in the sequence for which the second effective stimulus duration is calculated.

\* \* \* \* \*